United States Patent
Lai et al.

(10) Patent No.: US 10,158,374 B1
(45) Date of Patent: Dec. 18, 2018

(54) SIGMA DELTA MODULATOR

(71) Applicant: Realtek Semiconductor Corporation, Hsinchu (TW)

(72) Inventors: Jie-Fan Lai, Hsinchu (TW); Yu-Chang Chen, New Taipei (TW); Shih-Hsiung Huang, Miaoli County (TW); Chih-Lung Chen, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/968,744

(22) Filed: May 1, 2018

(30) Foreign Application Priority Data

Dec. 29, 2017 (TW) .............................. 106146610 A

(51) Int. Cl.
*H03M 3/00* (2006.01)
(52) U.S. Cl.
CPC ........... *H03M 3/464* (2013.01); *H03M 3/424* (2013.01)
(58) Field of Classification Search
CPC .............................. H03M 3/464; H03M 3/424
USPC .................................................. 341/143, 155
See application file for complete search history.

(56) References Cited

U.S. PATENT DOCUMENTS

| 6,522,277 B2* | 2/2003 | Fujimori | H03M 1/0665 341/118 |
| 9,007,249 B2* | 4/2015 | Ho | H03F 3/265 341/143 |
| 9,024,795 B2* | 5/2015 | Muthers | H03M 3/322 341/143 |
| 9,035,814 B2* | 5/2015 | Chang | H03M 3/30 341/143 |
| 2003/0189504 A1 | 10/2003 | Colonna et al. | |

OTHER PUBLICATIONS

Chi-Yun Wang et al., "A Mode-Configurable Analog Baseband for Wi-Fi 11ac Direct-Conversion Receiver Utilizing a Single Filtering ΔΣ ADC", IEEE Radio Frequency Integrated Circuits Symposium, 2016, pp. 170-173.
Yonghua Cong et al., "A 1.5-V 14-Bit 100-MS/s Self-Calibrated DAC", IEEE Journal of Solid-State Circuits, vol. 38, No. 12, Dec. 2003, pp. 2051-2060.
John G. Kauffman et al., "An 8.5 mW Continuous-Time ΔΣ Modulator With 25 MHz Bandwidth Using Digital Background DAC Linearization to Achieve 63.5 dB SNDR and 81 dB SFDR", IEEE Journal of Solid-State Circuits, vol. 46, No. 12, Dec. 2011, pp. 2869-2881.

* cited by examiner

*Primary Examiner* — Brian K Young
(74) *Attorney, Agent, or Firm* — CKC & Partners Co., Ltd.

(57) ABSTRACT

A sigma delta modulator includes an integrator, a quantizer, a randomization circuit, and a digital to analog converter circuit. The integrator is configured to integrate an analog signal, in order to generate a first signal, in which the analog signal is a sum of an input signal and a second signal. The quantizer is coupled to the integrator and configured to quantize the first signal to generate a digital signal which has a plurality of bits. The randomization circuit is coupled to the quantizer, and is configured to randomize partial bits in the plurality of bits of the digital signal, in order to generate first control signals. The digital to analog converter (DAC) circuit is coupled to the quantizer and the randomization circuit, and is configured to generate the second signal according to the first control signals and remaining bits in the plurality of bits of the digital signal.

20 Claims, 4 Drawing Sheets

SIGMA DELTA MODULATOR

RELATED APPLICATIONS

This application claims priority to Taiwan Application Serial Number 106146610, filed Dec. 29, 2017, which is herein incorporated by reference.

BACKGROUND

Technical Field

The present disclosure relates to a sigma delta modulator. More particularly, the present disclosure relates to a sigma delta modulator having a randomization mechanism.

Description of Related Art

A sigma delta modulator is often applied to a high speed and high resolution digital to analog conversion. In order to meet the high speed and high resolution requirements, different calibration mechanisms may be employed in a digital to analog converter (DAC), in order to calibrate nonlinearity of the internal circuits. However, as the required resolution becomes higher, the circuit area of the DAC becomes larger, and thus a critical path in the DAC and/or the calibration mechanism(s) is longer. As a result, the practical DAC is difficult to meet the current speed and resolution requirements.

SUMMARY

An aspect of the present disclosure is to provide a sigma delta modulator. The sigma delta modulator includes an integrator, a quantizer, a randomization circuit, and a digital to analog converter circuit. The integrator is configured to integrate an analog signal, in order to generate a first signal, in which the analog signal is a sum of an input signal and a second signal. The quantizer is coupled to the integrator and configured to quantize the first signal to generate a digital signal which has a plurality of bits. The randomization circuit is coupled to the quantizer, and is configured to randomize partial bits in the plurality of bits of the digital signal, in order to generate a plurality of first control signals. The digital to analog converter circuit is coupled to the quantizer and the randomization circuit, and is configured to generate the second signal according to the plurality of first control signals and remaining bits in the plurality of bits of the digital signal.

As described above, the sigma-delta modulator of the present disclosure is arranged to randomize partial bits outputted from the quantizer, in order to reduce circuit area while meeting the high speed requirement.

BRIEF DESCRIPTION OF THE DRAWINGS

This disclosure can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

Figure 1:
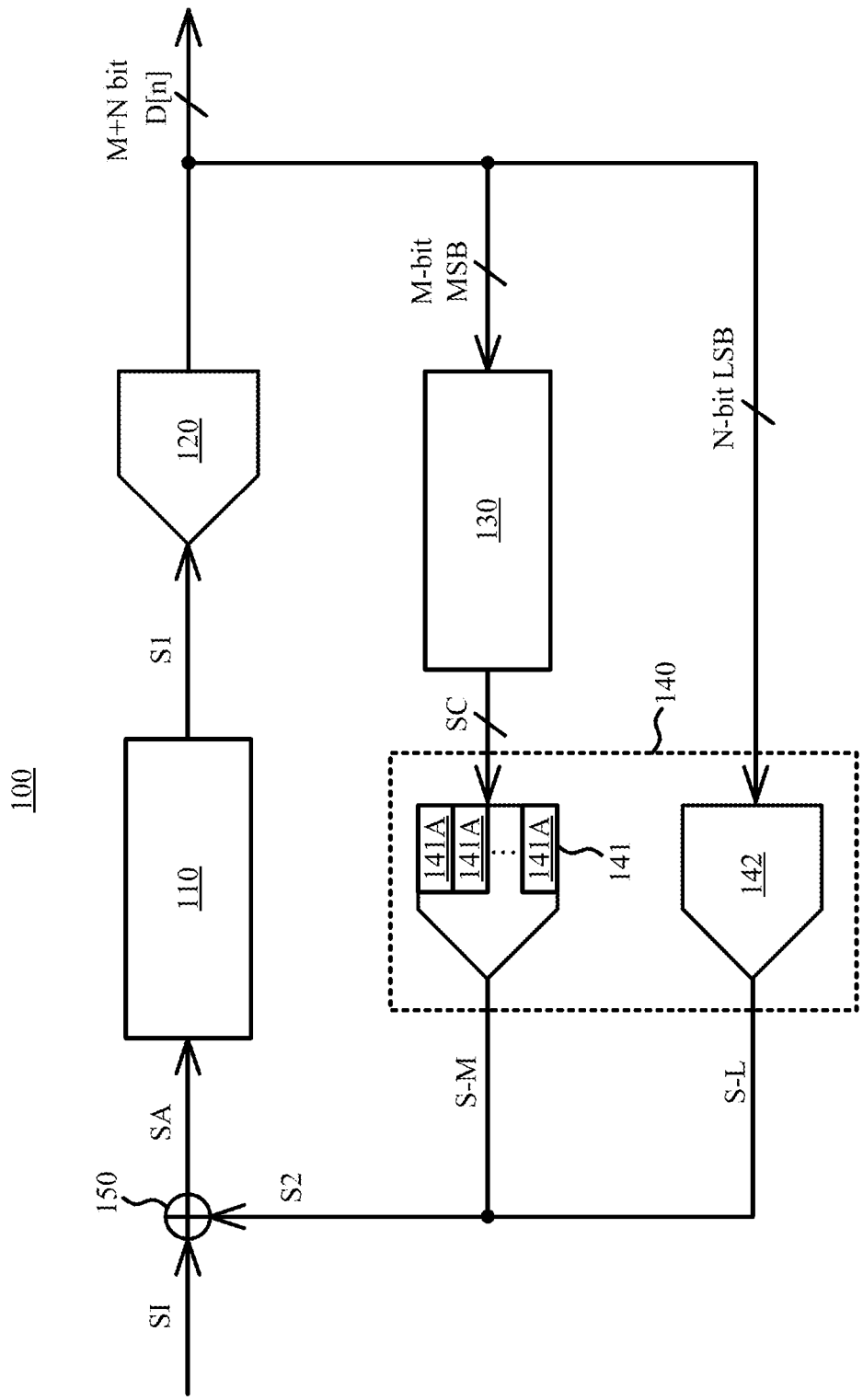
FIG. 1 is a schematic diagram of a sigma-delta modulator according to some embodiments of the present disclosure.

Reference is made to FIG. 1. FIG. 1 is a schematic diagram of a sigma-delta modulator 100 according to some embodiments of the present disclosure. In some embodiments, the sigma-delta modulator 100 is a continuous time sigma-delta modulator.

In some embodiments, the sigma-delta modulator 100 includes an integrator 110, a quantizer 120, a randomization circuit 130, and a digital to analog converter (DAC) circuit 140.

The integrator 110 is configured to integrate an analog signal SA, in order to generate a signal S1. In some embodiments, the integrator 110 may be implemented with a low-pass filter circuit. In some other embodiments, the low-pass filter circuit may be implemented with a resistor, a capacitor, and/or an amplifier circuit.

In some embodiments, the analog signal SA is a sum of an input signal SI and a signal S2 generated from the DAC circuit 140. In some embodiments, the sigma-delta modulator 100 further includes an adder 150, which is configured to sum up the input signal SI and the signal S2 to generate the analog signal SA. In some other embodiments, the DAC circuit 140 is implemented with a current DAC. Under this condition, an output of the DAC circuit 140 and a terminal providing the input signal SI is connected to inputs of the integrator 110. Accordingly, the analog signal SA is able to be directly generated without employing the adder 150.

The quantizer 120 is coupled to the integrator 110 to receive the signal S1, and is configured to quantize the signal S1 into a digital signal D[n] having (M+N)-bits, in which M and N are positive numbers. The M bits of the digital signal D[n] are referred to as most significant bit (MSB). The remaining N bits of the digital signal D[n] are referred to as least significant bit (LSB).

In some embodiments, the quantizer 120 may be implemented with a comparator circuit. In some embodiments, the quantizer 120 may be implemented with a successive approximation register analog-to-digital converter (ADC).

In some other embodiments, the quantizer 120 may be implemented with a flash ADC. Furthermore, in various embodiments, an additional mechanism (not shown) for compensating excess loop delay may be applied to the quantizer 120.

The randomization circuit 130 is coupled to the quantizer 120, in order to receive the digital signal D[n]. The randomization circuit 130 is configured to perform a randomization algorithm according to the M-bit of the digital signal D[n] (i.e., MSB), in order generate control signals SC. In some embodiments, one control signal SC, which corresponds to the M-bit MSB of the digital signal D[n], may be encoded in a form of thermometer code, but the present disclosure is not limited thereto.

In some embodiments, the randomization algorithm includes data weighted averaging (DWA) or dynamic element matching (DEM). The algorithms given above are able to reduce mismatches of the DAC circuit 140 (e.g., mismatches, at low frequency band, between the unity current sources, timing mismatches, etc.), in order to improve static errors and dynamic errors of the DAC circuit 140.

The DAC circuit 140 is coupled to the randomization circuit 130 to receive the control signals SC, and is coupled to the quantizer 120 to receive the N-bit LSB. In some embodiments, the DAC circuit 140 is configured to generate the signal S2 according to the control signals SC and the N-bit LSB of the digital signal D[n].

In some embodiments, the DAC circuit 140 is a current DAC. For example, the DAC circuit 140 includes a DAC 141 and a DAC 142. The DAC 141 is configured to process the M-bit MSB. For example, the DAC 141 includes unity components 141A, and each of the unity components 141A is turned on or off according a corresponding one of control signals SC, such that the unity components 141A generate a current S-M, corresponding to the M-bit MSB, to an output terminal of the DAC 141. In some embodiments, the unity component 141A may be a unity capacitor or a unity current source. The DAC 142 generates a current S-L, corresponding to the N-bit LSB, to an output terminal of the DAC 142 according to the N-bit LSB. The signal S2 is a sum of the current outputted from the DAC 141 and the current outputted from the DAC 142.

In some related approaches, the randomization circuit is configured to randomize all bits (i.e., M+N bits) of the signal outputted from the quantizer. In these approaches, more circuits are required to process each bit, and thus the circuit area becomes larger. Furthermore, more circuits indicate that a critical path of the randomization circuit is longer. As a result, the latency is longer, and the modulator is thus difficult to meet a high speed requirement.

Compared with these approaches, the randomization circuit 130 only performs the randomization according to partial bits (i.e., M-bit MSB) of the digital signal D[n] outputted from the quantizer 120. With this arrangement, not only the number of the circuits and the circuit area of the randomization circuit 130 but also the latency of the randomization circuit 130 are reduced. As a result, the sigma-delta modulator 100 is sufficient to meet the high speed requirement.

In some embodiments, if M+N equals to 6 or 8, M is set to be 3. In other words, in different embodiments, a ratio of M and M+N is about 37.5-50%. In some other embodiments, the ratio of M and M+N is about 30-60%. The values are given for illustrative purposes, and various values able to be applied to the present disclosure are within the contemplated scope of the present disclosure.

The following paragraphs will describe embodiments regarding to the sigma-delta modulator 100. For ease of understanding, the following embodiments are described with reference to examples of using the DWA algorithm as the randomization algorithm. However, as noted above, other types of the randomization algorithm (e.g., DEM) are also within the contemplated scope of the present disclosure. Thus, the present disclosure is not limited to the following embodiments.

Figure 2A:
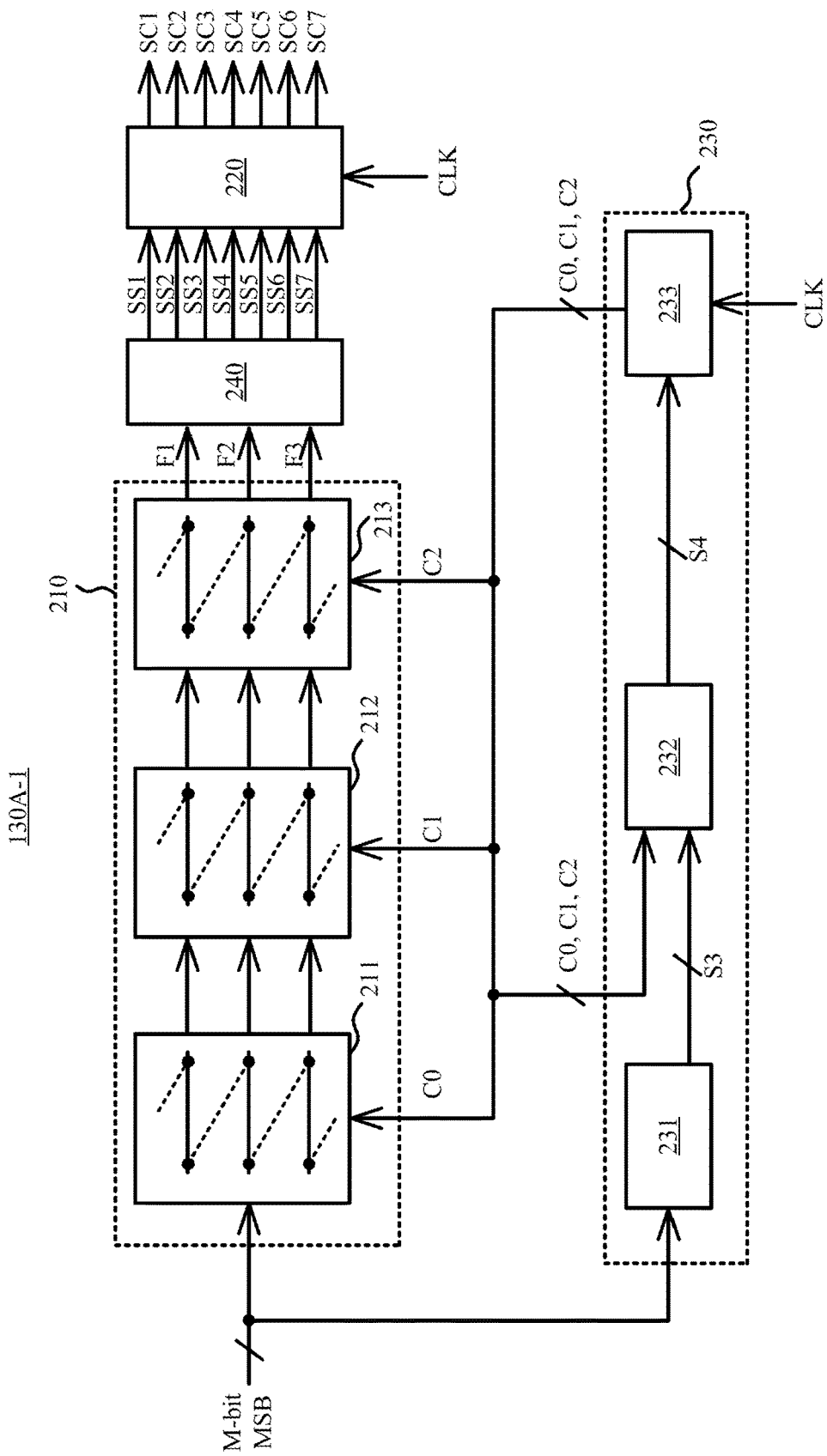
FIG. 2A is a circuit diagram of the randomization circuit in FIG. 1, according to some embodiments of the present disclosure.

Reference is made to FIG. 2A. FIG. 2A is a circuit diagram of the randomization circuit in FIG. 1, according to some embodiments of the present disclosure. For ease of understanding, like elements in FIG. 2A are designated with the same reference numbers with respect to FIG. 1.

In FIG. 2A, a randomization circuit 130A-1 performs the DWA algorithm, in which M is set to be 3, but the present disclosure is not limited thereto. The randomization circuit 130A-1 includes a barrel shifter 210, a register 220, a mapping circuit 240, and a control circuit 230.

The barrel shifter 210 includes shifters 211, 212, and 213. In some embodiments, the shifters 211, 212, and 213 may be implemented with multiplexer circuits, in which these multiplexer circuits are switched according to corresponding control signals C0, C1, and C2. The shifter 211 is coupled to the quantizer 120 in FIG. 1, in order to receive the M-bit (in this example, M=3) MSB. The shifters 211, 212, and 213 sequentially shift the M-bit MSB according to the control signals C0, C1, and C2, respectively. Equivalently, the M-bit MSB is alternately shifted by the shifters 211-213. The shifters 211-213 output the shifted 3-bit MSB (labeled as F1, F2, and F3) to the mapping circuit 240. The mapping circuit 240 outputs shifted signals SS1-SS7 to the register 220 according to the bits F1, F2, and F3 and the control signals C0, C1, and C2. The register 220 outputs the shifted signals SS1-SS7 as control signals SC1 SC7 (corresponding to the control signals SC in FIG. 1) according to the clock signal CLK. As mentioned above, each of the control signal SC1-SC7 is employed to control a corresponding unity component 141A in FIG. 1. In other words, the control signals SC1-SC7 is a thermometer code corresponding to the 3-bit MSB.

In some embodiments, the mapping circuit 240 may be implemented with an encoder, but the present disclosure is not limited thereto. The mapping circuit 240 is coupled to the barrel shifter 210, in order to receive the bits F1, F2, and F3. In some embodiments, the mapping circuit 240 may determine a corresponding relationship between the bits F1-F3 and the 3-bit MSB according to the control signals C0, C1, and C2, and outputs the control signals SS1-SS7 in the corresponding order. For example, if the bits F2, F3, and F1 sequentially correspond to the 3-bit MSB (i.e., the 3-bit MSB may be expressed as F2F3F1), the shifted signal SS1 corresponds to the bit F1, the shifted signals SS2-SS5 correspond to the bit F2, and the shifted signals SS6-SS7 correspond to the bit F3; if the bits F3, F1, and F2 sequentially correspond to the 3-bit MSB (i.e., the 3-bit MSB may be expressed as F3F1F2), the shifted signals SS1-SS2 correspond to the bit F1, the shifted signal SS3 corresponds to the bit F2, and the shifted signals SS4-SS7 correspond to the bit F3.

The control circuit 230 includes an encoder 231, an adder 232, and a register 233. The encoder 231 is configured to encode the M-bit MSB, in order to generate the signal S3. The adder 232 sums up the control signals C0-C2 and the signal S3, in order to generate a signal S4. The register 233 outputs the control signals C0-C2 according to the clock signal CLK and the signal S4. The arrangements of the control circuit 230 are given for illustrative purposes, and various control circuits to implement the same function are within the contemplated scope of the present disclosure.

If M+N is 8 and M is 3, in view of the aforementioned related approaches, the encoder 231, the adder 232, the register 233 and 220 are implemented with circuits for processing 8-bit signals, and eight encoders are employed to implement the barrel shifter 210. Compared with the above approaches, in this disclosure, any one of the encoder 231, the adder 232, and the register 233 is implemented with at least one circuit for processing 3-bit signals, and only three encoders are employed to implement the barrel shifter 210. Accordingly, the number of circuits, the area, and latency are able to be reduced.

Figure 2B:
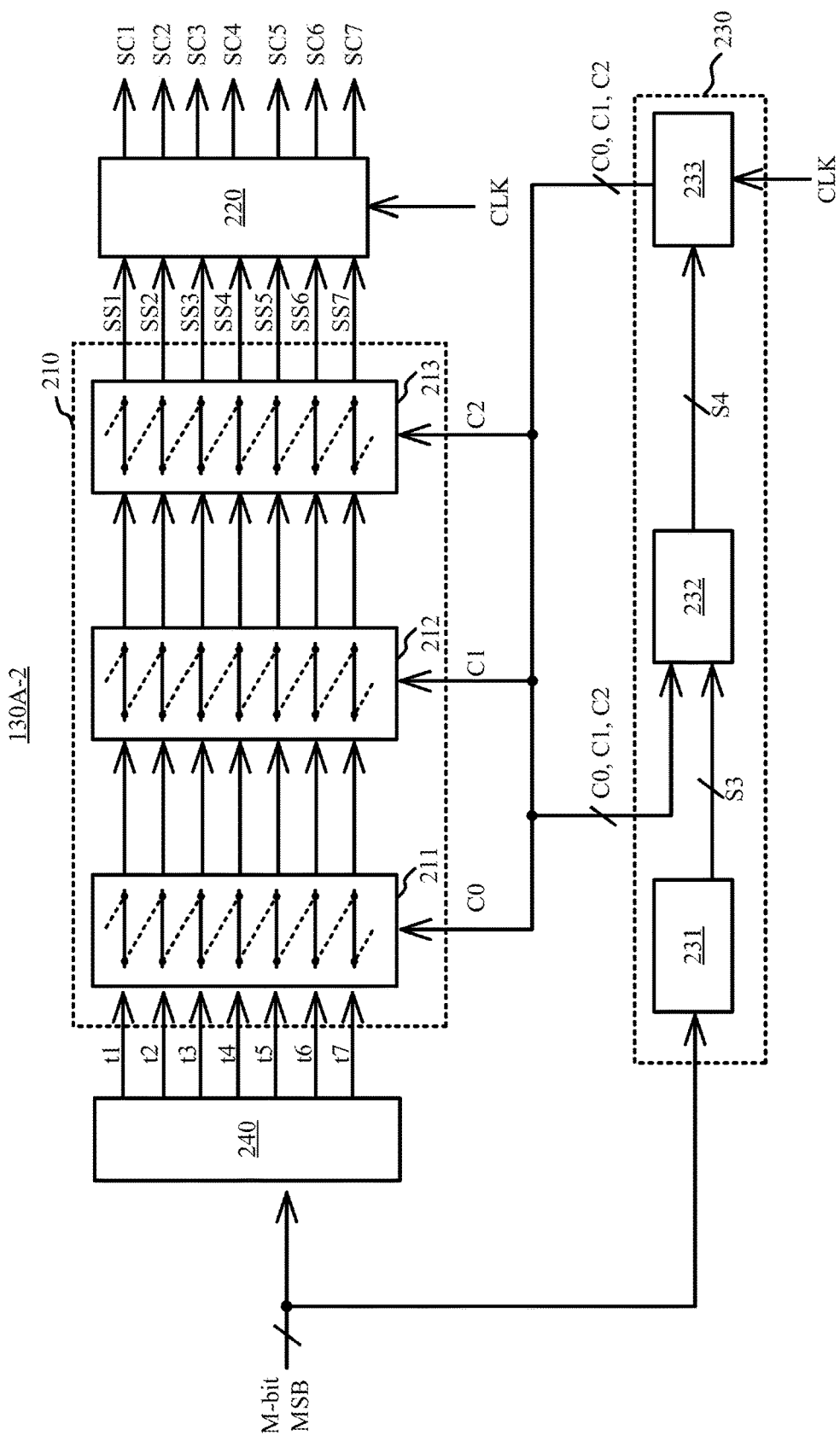
FIG. 2B is a circuit diagram of the randomization circuit in FIG. 1, according to some embodiments of the present disclosure.

Reference is now made to FIG. 2B. FIG. 2B is a circuit diagram of the randomization circuit in FIG. 1, according to some embodiments of the present disclosure. For ease of understanding, like elements in FIG. 2B are designated with the same reference numbers with respect to FIG. 2A.

Compared with FIG. 2A, in a randomization circuit 130A-2 of FIG. 2B, the mapping circuit 240 is arranged prior to the barrel shifter 210, in order to be coupled to the quantizer 120 in FIG. 1 to receive the M-bit MSB. In other words, in this example, the M-bit MSB is pre-processed by the mapping circuit 240 to generate digital codes (e.g., thermometer code) t1-t7.

The barrel shifter 210 is coupled to the mapping circuit 240, in order to receive the digital codes t1-t7. The shifters 211, 212, and 212 shift the digital codes t1-t7 according to the control signals C0, C1, and C2, respectively, in order to generate the shifted signals SS1-SS7 and to transmit the same to the register 220. Accordingly, the register 220 outputs the shifted signals SS1-SS7 as the control signal SC1-SC7 according to the clock signal CLK.

For example, as shown in FIG. 2B, the control signals C0-C2 are sequentially configured to control the shifters 211, 212, and 213. If the control signal C0 is 1, the digital codes are shifted by 4 bit-positions; if the control signal C1 is 1, the digital codes are shifted by 2 bit-positions; and if the control signal C2 is 1, the digital codes are shifted by 1 bit-position. In other words, if the control signals C0-C2 are expressed as C0C1C2 and if C0C1C2 is 000, the digital codes are not shifted; if C0C1C2 is 001, the digital codes are shifted by 1 bit-position; and if C0C1C2 is 010, the digital codes are shifted by 2 bit-positions. With this analogy, if C0C1C2 is 110, the digital codes are shifted by 6 bit-positions.

In some embodiments, the barrel shifter 210 in FIG. 2B may be implemented with a single shifter, and this single shifter may receive the control signals C0-C2, and may shift the digital codes according to the received control signals.

The arrangements of circuits shown in FIG. 2A and FIG. 2B are given for illustrative purposes. Various arrangements are within the contemplated scope of the present disclosure.

Figure 3:
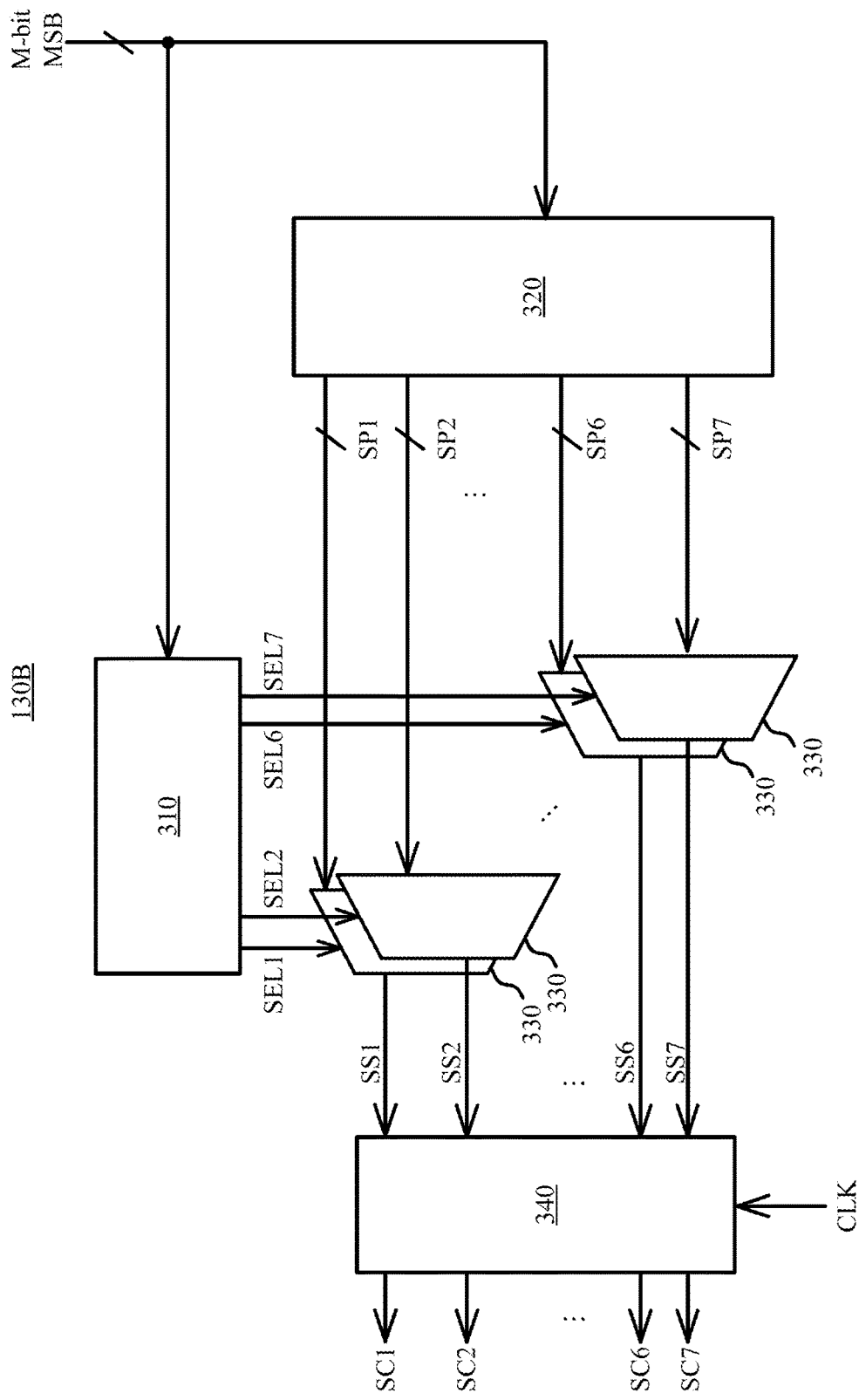
FIG. 3 is a circuit diagram of the randomization circuit in FIG. 1 according to some embodiments of the present disclosure.

Reference is made to FIG. 3. FIG. 3 is a circuit diagram of the randomization circuit in FIG. 1 according to some embodiments of the present disclosure. For ease of understanding, like elements in FIG. 3 are designated with the same reference numbers with respect to FIG. 1.

For ease of understanding, the circuit arrangement in FIG. 3 is illustrated with an example of M=3. In this example, the randomization circuit 130B performs the DWA algorithm. The randomization circuit 130B includes a pointer 310, an encoder 320, multiplexer circuits 330, and a register 340. The pointer 310 is configured to perform a calculation according to the M-bit MSB, in order to generate selection signals SEL1-SEL7. The pointer 310 may be implemented with a digital circuit for processing M-bit signals. For example, the pointer 310 may be implemented with an encoder, one or more accumulators, and a register. In this example, the number of the unity components 141A is $2^M-1$. The pointer 310 performs the calculation according to the DWA algorithm, in order to point one component of the unity components 141A as an initial point of next operation.

The encoder 320 is coupled to the quantizer 120 in FIG. 1, in order to receive the M-bit MSB of the digital signal D[n]. In some embodiments, the encoder 320 perform an encoding conversion according to the M-bit MSB, in order to generate $2^M-1$ input patterns SP. If M=3, the encoder 320 outputs seven different input patterns SP1-SP7 to the multiplexer circuits 330. For example, the 3-bit MSB is 101, the corresponding thermometer code is 0011111, and the encoder 320 may shift this thermometer code to generate the input patterns SP1-SP7. Under this condition, the selection signals SEL1-SEL8 may be set to have the same signal values, in order to achieve the randomization.

Alternatively, in some other embodiments, the selection signals SEL1-SEL8 may have different signal values, and the input patterns SP may have the same signal value. With this arrangement, effectively, the randomization is achieved as well.

In various embodiments, the encoder 320 may be implemented with other digital code converter(s) or register circuits. The input patterns are given for illustrative purposes, and various input patter able to be applied to the present disclosure are within the contemplated scope of the present disclosure.

In this example, the number of the multiplexer circuits 330 is $2^M-1$. Each of the multiplexer circuits 330 is coupled to the pointer 310 to receive a corresponding signal SEL, and is coupled to the encoder 320 to receive a corresponding one of the input patterns SP1-SP7. Each of the multiplexer circuits 330 is configured to output a bit of the corresponding one of the input patterns SP1-SP7 as a corresponding one of the shifted signal SS1-SS7 according to the selection signals SEL1-SEL7.

The register 340 is coupled to the multiplexer circuits 330 to receive the shifted signals SS1-SS7, and outputs the shifted signals SS1-SS7 as the control signals SC1-SC7 (which correspond to control signals SC in FIG. 1) according to the clock signal CLK, respectively. As mentioned above, each of the control signals SC1-SC7 is configured to control a corresponding unity component 141A in FIG. 1.

Equivalently, the randomization circuit 130B or the randomization circuits 130A-1 and 130A-2 in FIGS. 2A-2B may operate as a data shuffler or a scrambler that is configured to scatter and to map the relationship between the M-bit MSB and the unity components 141A of the DAC 141 in FIG. 1. The arrangements of the randomization circuit 130 are given for illustrative purposes. Various circuits able to perform the randomization algorithm are within the contemplated scope of the present disclosure.

As described above, the sigma-delta modulator 100 of the present disclosure may be arranged to randomize partial bits outputted from the quantizer, in order to reduce circuit area while meeting the high speed requirement.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A sigma delta modulator, comprising:
   an integrator configured to integrate an analog signal, in order to generate a first signal, wherein the analog signal is a sum of an input signal and a second signal;
   a quantizer coupled to the integrator, and configured to quantize the first signal to generate a digital signal which has a plurality of bits;
   a randomization circuit coupled to the quantizer, and configured to randomize partial bits in the plurality of bits of the digital signal, in order to generate a plurality of first control signals, wherein the partial bits correspond to a most significant bit of the digital signal; and
   a digital to analog converter circuit coupled to the quantizer and the randomization circuit, and configured to generate the second signal according to the plurality of first control signals and remaining bits in the plurality of bits of the digital signal.

2. The sigma delta modulator of claim 1, wherein the remaining bits correspond to a least significant bit.

3. The sigma delta modulator of claim 1, wherein a ratio of a number of the partial bits and a number of the plurality of bits is 30%-60%.

4. The sigma delta modulator of claim 1, wherein the randomization circuit comprises:
   a barrel shifter configured to shift the partial bits according to a plurality of second control signals;
   a mapping circuit coupled to the barrel shifter, and configured to output a plurality of shifted signals according to the shifted partial bits;
   a first register coupled to the mapping circuit, and configured to output the plurality of shifted signals as the plurality of first control signals according to a clock signal; and
   a control circuit coupled to the barrel shifter, and configured to generate the plurality of second control signals according to the partial bits.

5. The sigma delta modulator of claim 4, wherein the control circuit comprises:
   an encoder coupled to the quantizer to receive the partial bits, and the encoder configured to encode the partial bits, in order to generate a third signal;
   an adder configured to sum up the third signal and the plurality of second control signals, in order to generate a fourth signal; and
   a second register configured to output the plurality of second control signals according to the fourth signal and the clock signal.

6. The sigma delta modulator of claim 5, wherein a number of the partial bits is M, M is a positive number, and any one of the encoder, the adder, the first register, and the second register is implemented with at least one circuit for processing M-bit signals.

7. The sigma delta modulator of claim 4, wherein the barrel shifter comprises:
   a plurality of shifters configured to sequentially shift the partial bits according to the second control signals.

8. The sigma delta modulator of claim 1, wherein the randomization circuit comprises:
   a mapping circuit coupled to the quantizer, and configured to output a plurality of digital codes according to the partial bits;
   a barrel shifter coupled to the mapping circuit, and configured to shift the plurality of digital codes according to a plurality of second control signals;
   a first register coupled to the barrel shifter, and configured to output the shifted digital codes as the plurality of first control signals according to a clock signal; and
   a control circuit coupled to the barrel shifter, and configured to generate the plurality of second control signals according to the partial bits.

9. The sigma delta modulator of claim 8, wherein the control circuit comprises:
   an encoder coupled to the quantizer to receive the partial bits, and the encoder configured to encode the partial bits to generate a third signal;
   an adder configured to sum up the third signal and the plurality of second control signals, in order to generate a fourth signal; and
   a second register configured to output the plurality of second control signals according to the fourth signal and the clock signal.

10. The sigma delta modulator of claim 1, wherein the randomization circuit comprises:
    a pointer coupled to the quantizer to receive the partial bits, and the pointer configured to perform a calculation according to the partial bits, in order to generate a plurality of selection signals;
    an encoder coupled to the quantizer to receive the partial bits, and the encoder configured to generate a plurality of input patterns according to the partial bits;
    a plurality of multiplexer circuits coupled to the encoder and the pointer, the plurality of multiplexer circuits configured to generate a plurality of shifted signals according to the plurality of selection signals and the plurality of input patterns; and
    a register coupled to the plurality of multiplexer circuits to receive the plurality of shifted signals, and the register configured to output the plurality of shifted signals as the plurality of first control signals.

11. The sigma delta modulator of claim 10, wherein a number of the partial bits is M, M is a positive number, and a number of the multiplexer circuits is $2^M$.

12. The sigma delta modulator of claim 1, wherein the digital to analog circuit comprises:
    a first digital to analog converter comprising a plurality of unity components configured to be turn on or off according to the plurality of first control signals, in order to generate a first signal value corresponding to the partial bits; and
    a second digital to analog converter configured to generate a second signal value according to the remaining bits, wherein the second signal is a sum of the first signal value and the second signal value.

13. The sigma delta modulator of claim 1, wherein a number of the partial bits is 3, and a number of the remaining bits is 5.

14. The sigma delta modulator of claim 1, wherein a number of the partial bits is 3, and a number of the remaining bits is 3.

15. The sigma delta modulator of claim 1, wherein a ratio of a number of the partial bits and a number of the plurality of bits is 37.5%-50%.

16. A sigma delta modulator, comprising:
    an integrator configured to integrate an analog signal, in order to generate a first signal, wherein the analog signal is a sum of an input signal and a second signal;
    a quantizer coupled to the integrator, and configured to quantize the first signal to generate a digital signal which has a plurality of bits;
    a randomization circuit coupled to the quantizer, and configured to randomize partial bits in the plurality of bits of the digital signal, in order to generate a plurality of first control signals; and a digital to analog converter circuit coupled to the quantizer and the randomization circuit, and configured to generate the second signal according to the plurality of first control signals and remaining bits in the plurality of bits of the digital signal, wherein the randomization circuit comprises:

a first circuit, configured to map and shift the partial bits according to a plurality of second control signals, and to output a plurality of shifted signals;

a first register coupled to the first circuit, and configured to output the plurality of shifted signals as the plurality of first control signals according to a clock signal; and a control circuit coupled to the first circuit, and configured to generate the plurality of second control signals according to the partial bits.

17. The sigma delta modulator of claim 16, wherein the first circuit comprises:

a barrel shifter configured to shift the partial bits according to the plurality of second control signals; and a mapping circuit coupled to the barrel shifter, and configured to output the plurality of shifted signals according to the shifted partial bits.

18. The sigma delta modulator of claim 16, wherein the first circuit comprises:

a mapping circuit coupled to the quantizer, and configured to output a plurality of digital codes according to the partial bits; and a barrel shifter coupled to the mapping circuit, and configured to shift the plurality of digital codes to generate the plurality of shifted signals according to the plurality of second control signals.

19. A sigma delta modulator, comprising:

an integrator configured to integrate an analog signal, in order to generate a first signal, wherein the analog signal is a sum of an input signal and a second signal;

a quantizer coupled to the integrator, and configured to quantize the first signal to generate a digital signal which has a plurality of bits;

a randomization circuit coupled to the quantizer, and configured to randomize partial bits in the plurality of bits of the digital signal, in order to generate a plurality of first control signals; and a digital to analog converter circuit coupled to the quantizer and the randomization circuit, and configured to generate the second signal according to the plurality of first control signals and remaining bits in the plurality of bits of the digital signal, wherein the randomization circuit comprises:

a pointer coupled to the quantizer to receive the partial bits, and the pointer configured to perform a calculation according to the partial bits, in order to generate a plurality of selection signals;

an encoder coupled to the quantizer to receive the partial bits, and the encoder configured to generate a plurality of input patterns according to the partial bits;

a plurality of multiplexer circuits coupled to the encoder and the pointer, the plurality of multiplexer circuits configured to generate a plurality of shifted signals according to the plurality of selection signals and the plurality of input patterns; and a register coupled to the plurality of multiplexer circuits to receive the plurality of shifted signals, and the register configured to output the plurality of shifted signals as the plurality of first control signals.

20. The sigma delta modulator of claim 19, wherein a number of the partial bits is M, M is a positive number, and a number of the multiplexer circuits is $2^M$.

* * * * *